United States Patent
Chen et al.

(10) Patent No.: US 11,996,327 B2
(45) Date of Patent: May 28, 2024

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Yu-An Chen, Hsinchu (TW); I-Chang Lee, Taoyuan (TW); Chih-Yuan Ting, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 437 days.

(21) Appl. No.: 17/473,017

(22) Filed: Sep. 13, 2021

(65) Prior Publication Data

US 2022/0344204 A1    Oct. 27, 2022

Related U.S. Application Data

(60) Provisional application No. 63/178,009, filed on Apr. 22, 2021.

(51) Int. Cl.
*H01L 21/768* (2006.01)
*H01L 21/02* (2006.01)
(Continued)

(52) U.S. Cl.
CPC .... *H01L 21/76877* (2013.01); *H01L 21/0228* (2013.01); *H01L 21/31116* (2013.01); *H01L 21/76832* (2013.01); *H01L 29/401* (2013.01)

(58) Field of Classification Search
CPC ........... H01L 21/0228; H01L 21/76832; H01L 21/0337; H01L 21/76816; H01L 21/31144; H01L 21/31116; H01L 21/76877; H01L 29/401; H01L 21/31138; H01L 21/32137; H01L 29/66795; H01L 21/76831; H01L 21/7682; H01L 21/76826; H01L 21/76865; H01L 21/32; H01L 21/7685;
(Continued)

(56) References Cited

U.S. PATENT DOCUMENTS 9,105,490 B2   8/2015   Wang et al.
9,236,267 B2   1/2016   De et al.
(Continued)

FOREIGN PATENT DOCUMENTS

JP   2012164830 A   8/2012
KR   20200019835 A   2/2020
(Continued)

*Primary Examiner* — Mouloucoulaye Inoussa
(74) *Attorney, Agent, or Firm* — NZ CARR LAW OFFICE

(57) ABSTRACT

An interconnect structure, along with methods of forming such, are described. In some embodiments, the method includes forming a first dielectric layer over one or more devices, forming a first conductive feature in the first dielectric layer, and forming two dielectric features over the first dielectric layer and the first conductive feature. At least one of the two dielectric features has a first width, and each dielectric feature includes a first low-k dielectric layer, an oxide layer, and a first etch stop layer. The method further includes forming a second conductive feature between the two dielectric features, and the second conductive feature has a second width substantially the same as the first width.

20 Claims, 10 Drawing Sheets

(51) Int. Cl.
*H01L 21/311* (2006.01)
*H01L 29/40* (2006.01)

(58) Field of Classification Search
CPC ......... H01L 21/30617; H01L 21/76807; H01L 21/02271; H01L 21/3105; H01L 21/02167; H01L 23/5226; H01L 23/5329; H01L 23/5283; H01L 21/76834; H01L 21/76897

See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,483,119 B1 * | 11/2019 | Pan .................. H10N 70/20 |
| 2016/0005617 A1 * | 1/2016 | Wu .................. H01L 21/308 438/702 |
| 2019/0164805 A1 * | 5/2019 | Chou .................. H01L 21/743 |
| 2021/0082805 A1 * | 3/2021 | Haran ............... H01L 21/76877 |
| 2021/0111119 A1 | 4/2021 | Chang et al. |
| 2022/0359743 A1 * | 11/2022 | Lin .................. H01L 29/66545 |
| 2023/0067563 A1 * | 3/2023 | Su .................. H01L 23/5222 |
| 2023/0068760 A1 * | 3/2023 | Huang ............ H01L 21/76831 |

FOREIGN PATENT DOCUMENTS

| | | |
|---|---|---|
| TW | 202109809 | 3/2021 |
| TW | 202113997 | 4/2021 |

* cited by examiner

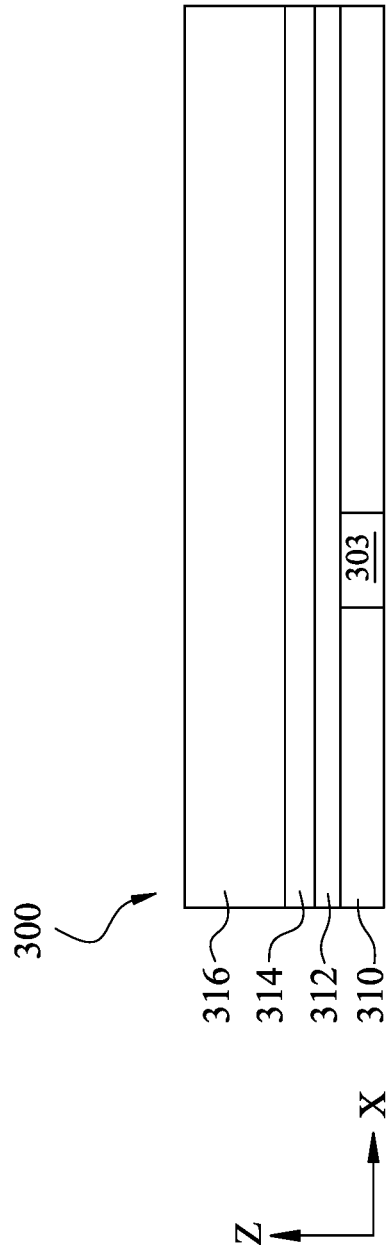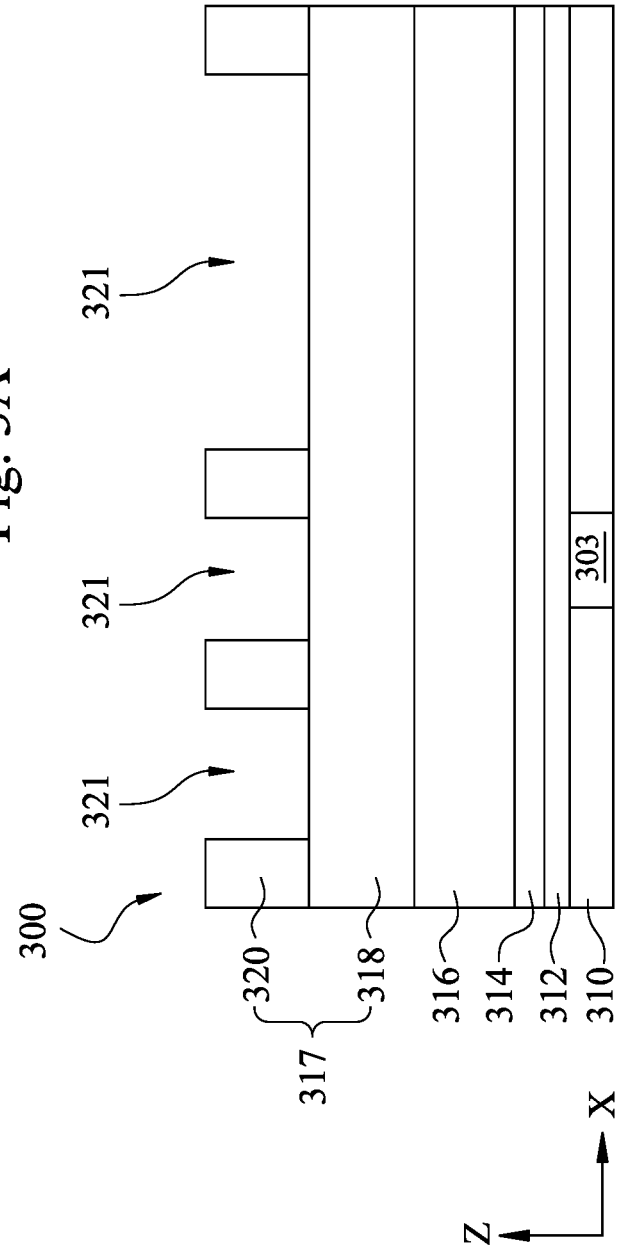

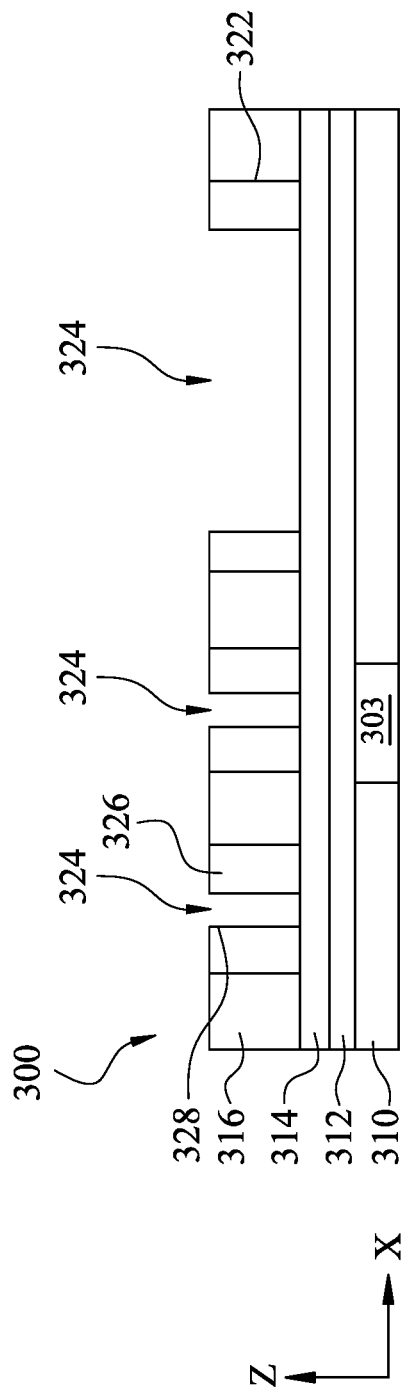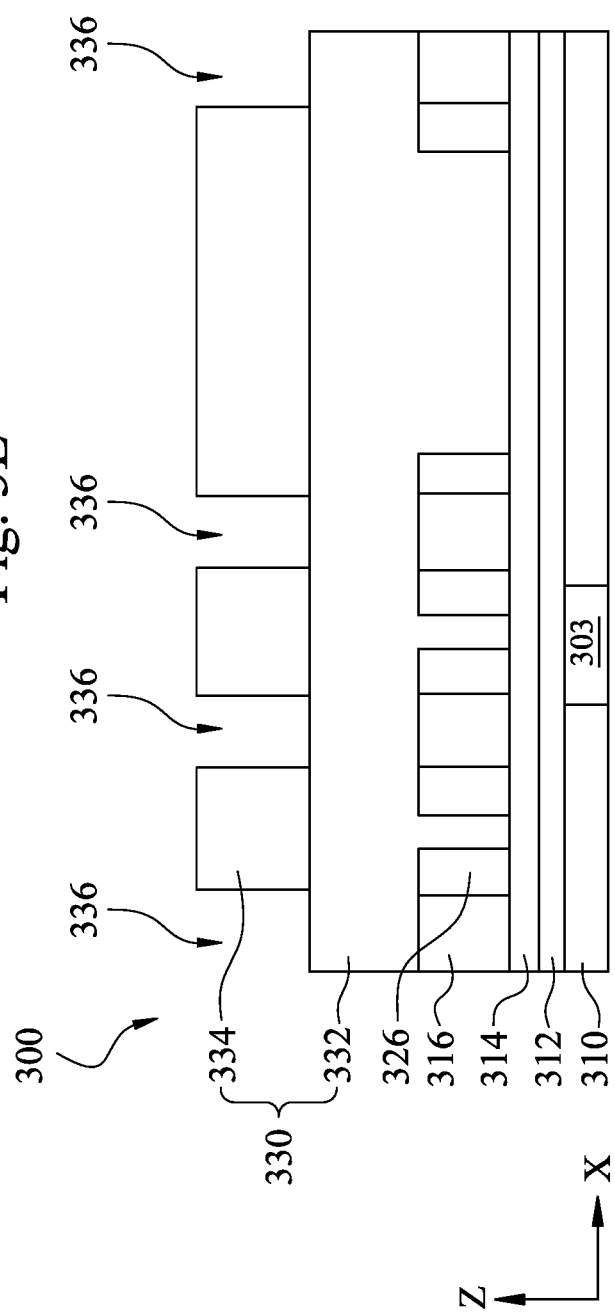

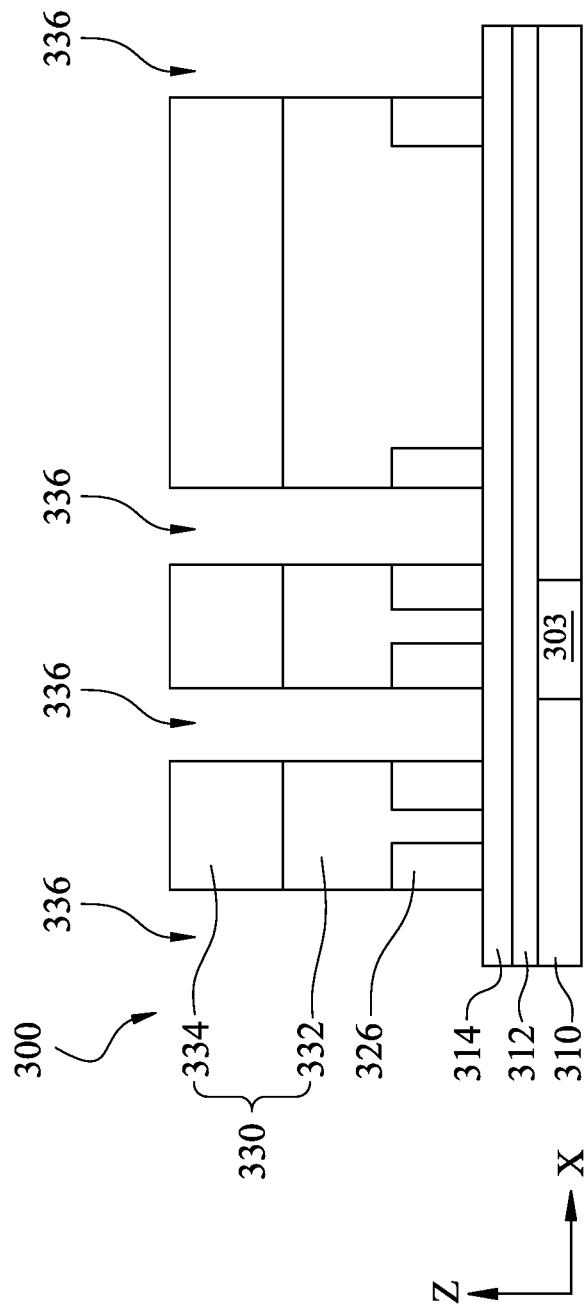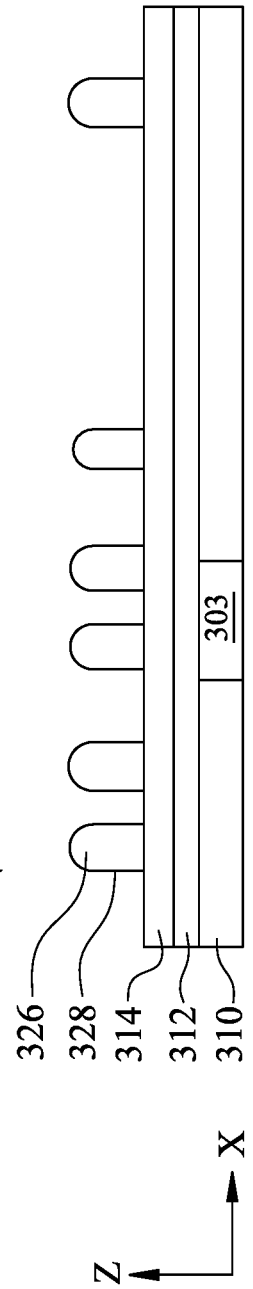

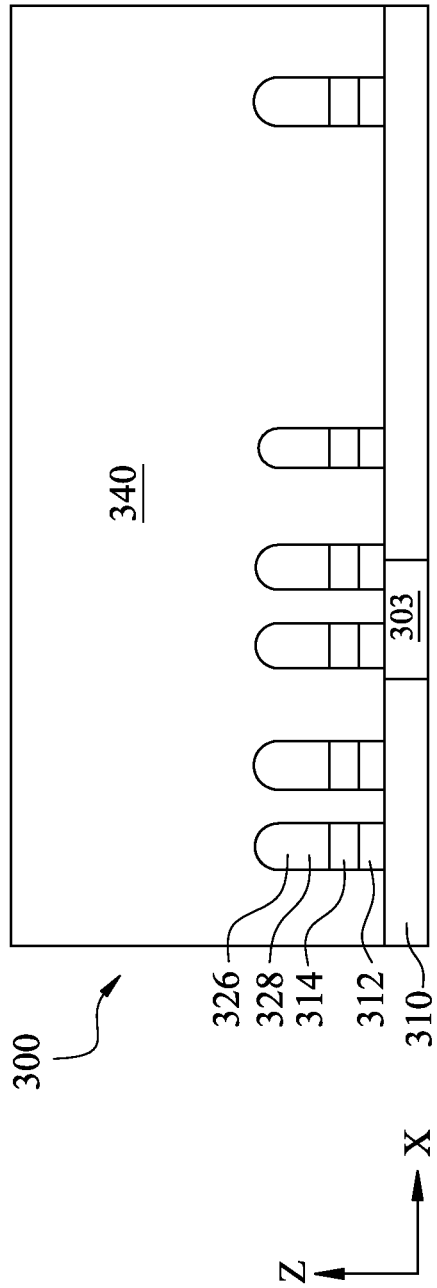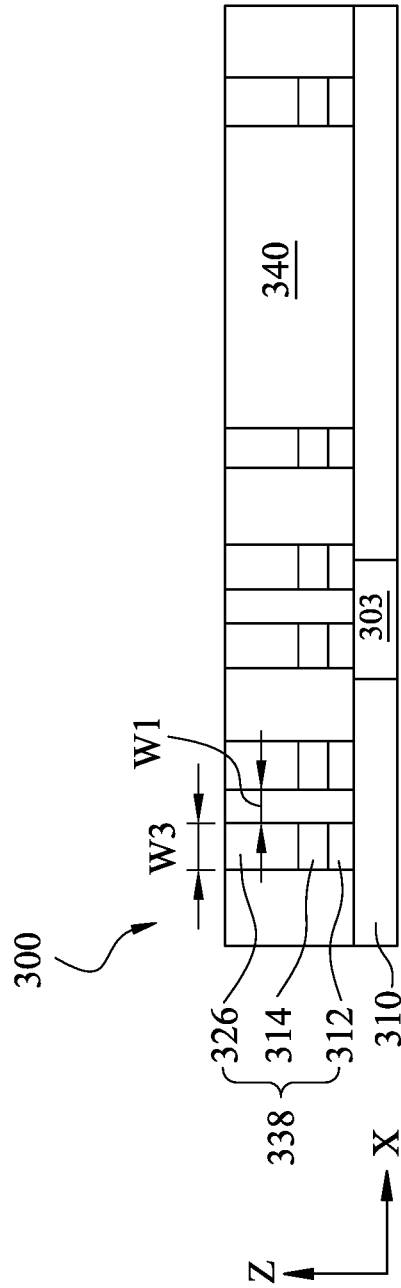

INTERCONNECT STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnect structure gets higher, the openings in the dielectric material for the conductive features may have tapered sidewalls, leading to worsened resistive-capacitive (RC) delay. Therefore, an improved interconnect structure and methods of forming the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3L are cross-sectional side views of various stages of manufacturing an interconnect structure, in accordance with some embodiments.

DETAILED DESCRIPTION

Figure 1A:
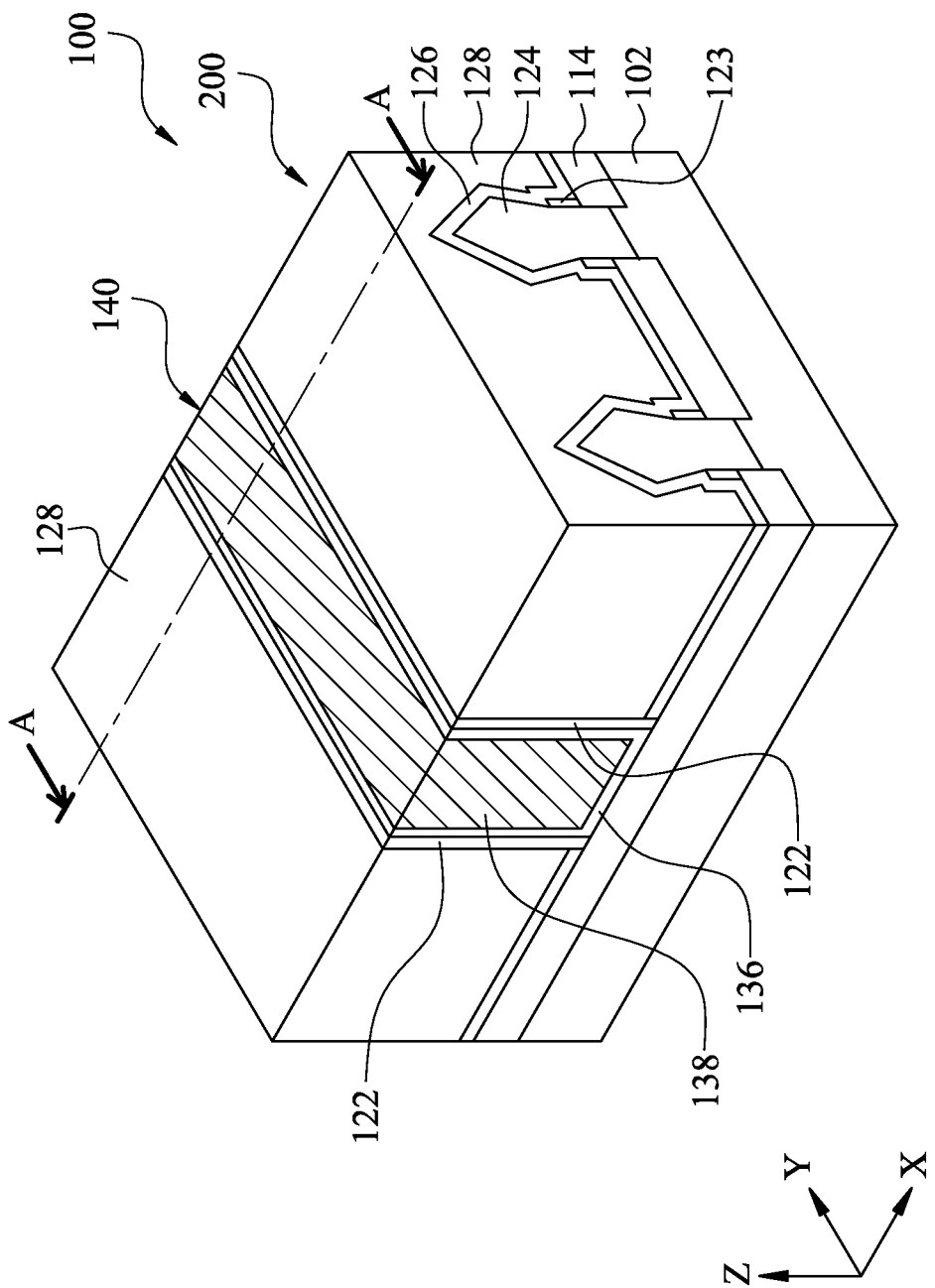
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
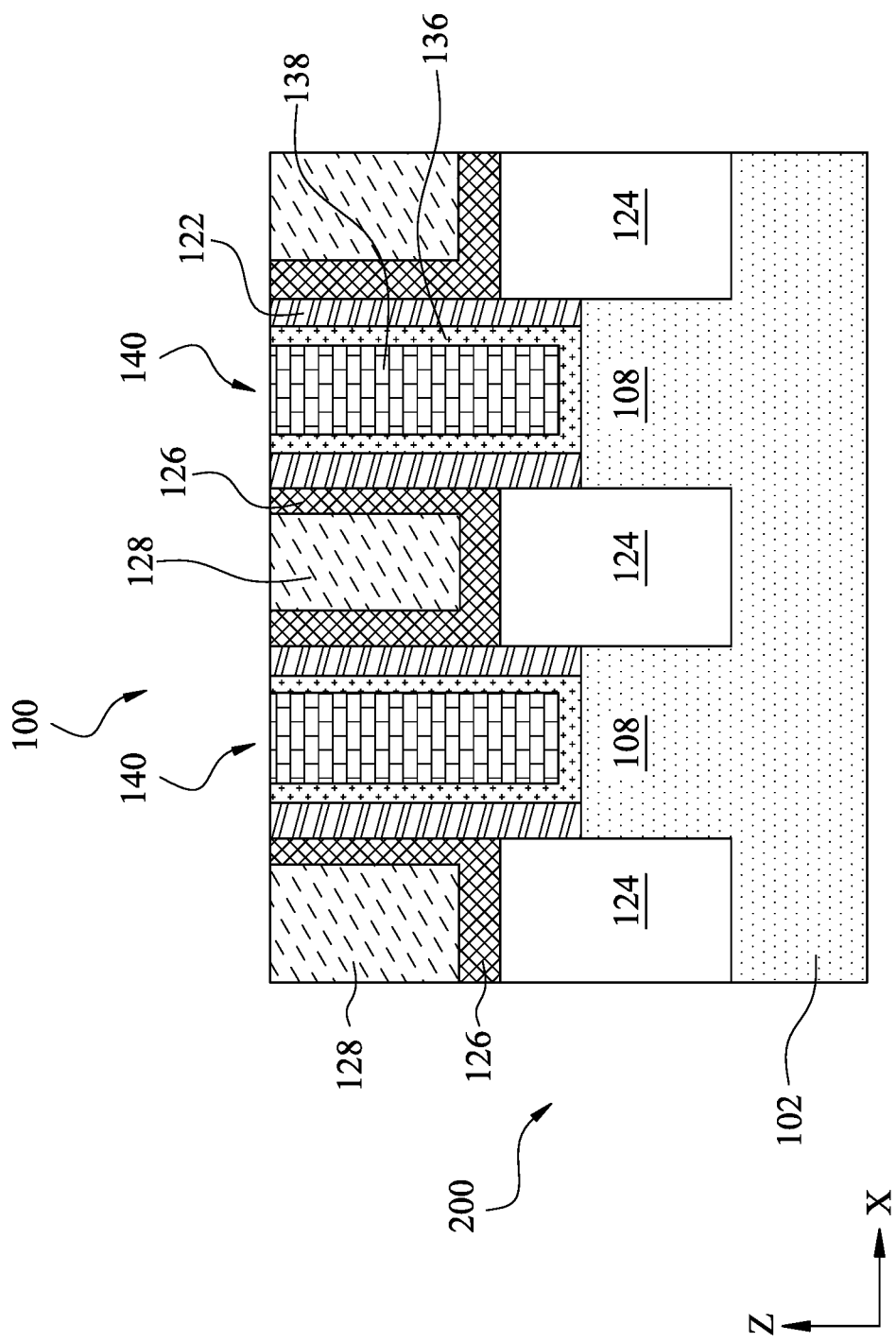
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136).

The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
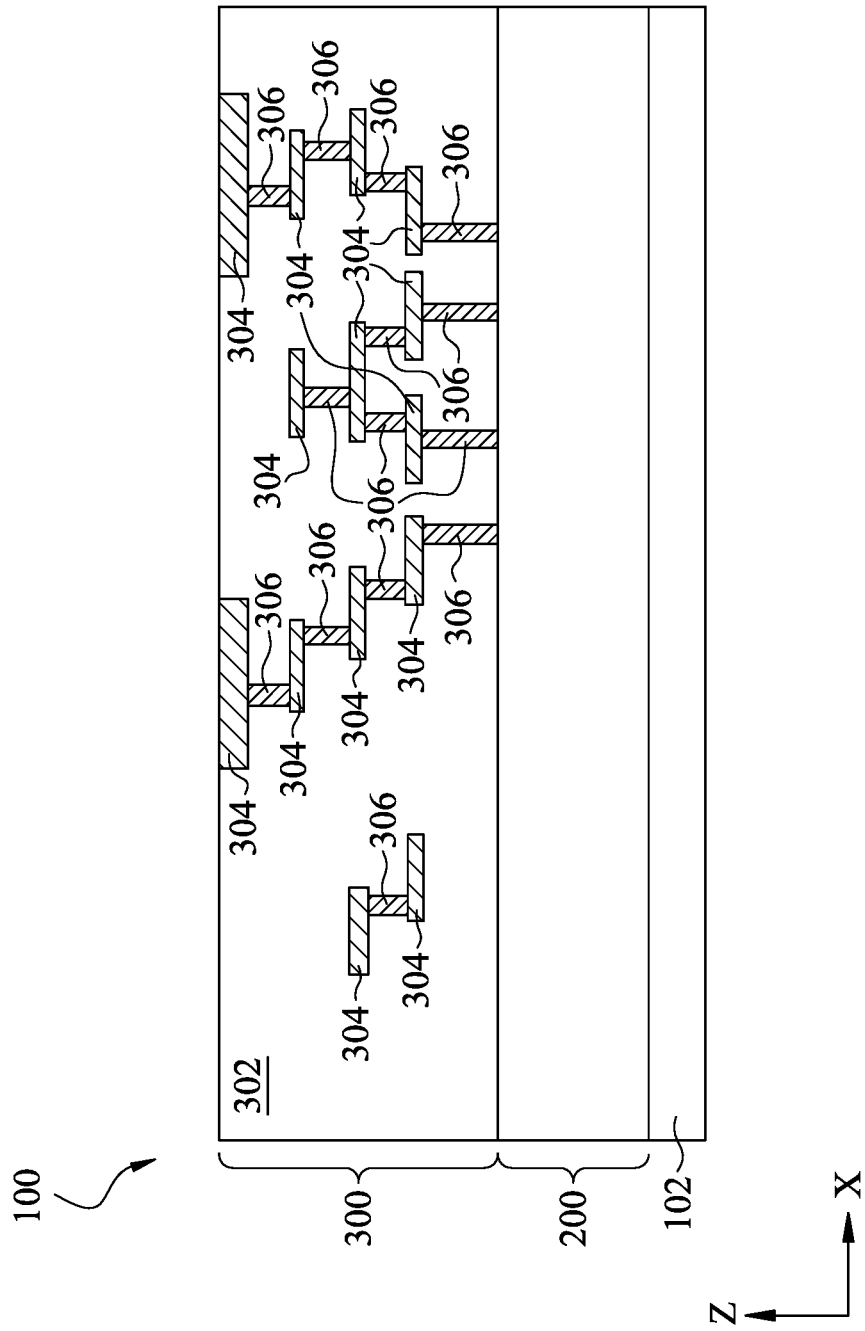
FIG. 2 is a cross-sectional side view of a stage of manufacturing the semiconductor device structure, in accordance with some embodiments.

The semiconductor device structure 100 may further includes an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottom-most conductive features 306 of the interconnection structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

Figure 3C:
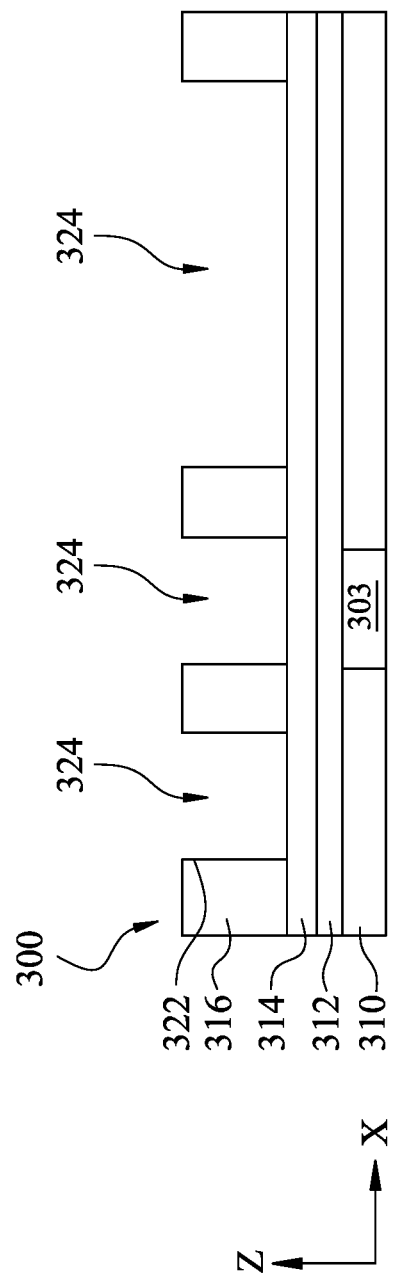

FIGS. 3A-3L are cross-sectional side views of various stages of manufacturing the interconnect structure 300, in accordance with some embodiments. As shown in FIG. 3A, the interconnect structure 300 includes a dielectric layer 310, which may be an ILD layer or an IMD layer. For example, the dielectric layer 310 may be the ILD layer 128 (FIGS. 1A and 1B) or the IMD layer 302 (FIG. 2). The dielectric layer 310 may include the same material as the ILD layer 128 or the IMD layer 302. In some embodiments, the dielectric layer 310 includes a low-k dielectric material, such as SiOCH. The dielectric layer 310 may be formed by CVD, FCVD, ALD, spin coating, or other suitable process. The dielectric layer 310 includes one or more conductive features 303 (only one is shown) disposed in the dielectric layer 310. The conductive feature 303 may include an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 303 includes a metal. The conductive feature 303 may be formed by PVD, CVD, ALD, or other suitable process. In some embodiments, the conductive feature 303 may be the conductive contact disposed in the ILD layer 128 or the conductive feature 304 or 306 disposed in the IMD layer 302.

A etch stop layer 312 is disposed on the dielectric layer 310. The etch stop layer 312 may include a nitrogen-containing material or an oxygen-containing material. For example, the etch stop layer 312 may be a nitride or an oxide, such as silicon nitride, a metal nitride, silicon oxide, or a metal oxide. In some embodiments, the etch stop layer 312 includes the same material as the CESL 126 (FIGS. 1A and 1B). The etch stop layer 312 may be formed by any suitable process, such as CVD, PECVD, ALD, or any suitable process. In some embodiments, the etch stop layer 312 is a conformal layer formed by ALD. The etch stop layer 312 may have a thickness less than about 10 nm, such as from about 1 nm to about 10 nm. The etch stop layer 312 provides a mechanism to stop an etch process when forming openings in the layers disposed over the etch stop layer 312. Thus, if the thickness of the etch stop layer 312 is less than about 1 nm, the etch stop layer 312 may not be sufficient to provide a mechanism to stop the etch process. The etch stop layer 312 may have a k value substantially greater than a k value of a low-k dielectric layer 326 (FIG. 3D) subsequently formed over the etch stop layer 312.

An oxide layer 314 is disposed on the etch stop layer 312. The oxide layer 314 may include a semiconductor or a metal. For example, the oxide layer 314 may be silicon dioxide formed from tetraethoxysilane (TEOS). The oxide layer 314 may have a high etch selectivity compared to the etch stop layer 312 and a sacrificial layer 316 disposed on the oxide layer 314. In some embodiments, the oxide layer 314 has a k value less than that of the etch stop layer 312 in order to reduce parasitic capacitance. The oxide layer 314 may be formed by any suitable process, such as CVD, PECVD, ALD, or any suitable process. In some embodiments, the oxide layer 314 is a conformal layer formed by ALD. The oxide layer 314 may have a thickness less than about 10 nm, such as from about 1 nm to about 10 nm. The oxide layer 314 provides a mechanism to stop an etch process when forming openings in the layers disposed over the oxide layer 314. Thus, if the thickness of the oxide layer 314 is less than about 1 nm, the oxide layer 314 may not be sufficient to provide a mechanism to stop the etch process. The oxide layer 314 may have a k value substantially greater than a k value of the low-k dielectric layer 326 (FIG. 3D) subsequently formed over the oxide layer 314.

The sacrificial layer 316 is disposed on the oxide layer 314. The sacrificial layer 316 may include a semiconductor material, such as amorphous silicon. The sacrificial layer 316 may be formed by any suitable process, such as CVD, PECVD, ALD, or any suitable process. The sacrificial layer 316 may have a thickness ranging from about 20 nm to about 30 nm. The total thickness of the sacrificial layer 316, the oxide layer 314, and the etch stop layer 312 may be the thickness of one IMD layer 302 shown in FIG. 2. Thus, the thickness of the sacrificial layer 316 may be based on the thickness of the IMD layer 302. In some embodiments, the total thickness of the sacrificial layer 316, the oxide layer 314, and the etch stop layer 312 may range from about 25 nm to about 50 nm.

As shown in FIG. 3B, a multilayer structure 317 is disposed on the sacrificial layer 316. The multilayer structure 317 includes one or more layers 318 and a photoresist layer 320 disposed on the one or more layers 318. In some embodiments, the multilayer structure 317 is a tri-layer photoresist. For example, the one or more layers 318 may include a bottom layer and a middle layer disposed on the bottom layer. The bottom layer and the middle layer are made of different materials such that the optical properties and/or etching properties of the bottom layer and the middle layer are different from each other. In some embodiments, the bottom layer may be an absorber layer, such as a chromium layer, and the middle layer may be a silicon-rich layer designed to provide an etch selectivity between the middle layer and the bottom layer. The photoresist layer 320 may be a chemically amplified photoresist layer and can be a positive tone photoresist or a negative tone photoresist. The photoresist layer 320 may include a polymer, such as phenol formaldehyde resin, a poly(norbornene)-co-malaic anhydride (COMA) polymer, a poly(4-hydroxystyrene) (PHS) polymer, a phenol-formaldehyde (hakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA). The photoresist layer 320 may be formed by spin-on coating.

As shown in FIG. 3B, the photoresist layer 320 is patterned. The patterning of the photoresist layer 320 may include exposing the photoresist layer 320 to an exposure light/beam through a photo mask (not shown). The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are performed. After the exposure process, a developing process is performed to form the patterned photoresist layer 320. As a result of the patterning process, openings 321 are formed in the photoresist layer 320, and portions of the one or more layers 318 are exposed.

As shown in FIG. 3C, the pattern of the photoresist layer 320 is transferred to the sacrificial layer 316. In some embodiments, the exposed portions of the one or more layers 318 are removed by one or more etch processes. In some embodiments, the one or more layers 318 includes the bottom layer and the middle layer, and portions of the bottom layer and middle layer are removed by two etch processes. For example, the exposed portions of the middle layer are first removed by a first etch process to expose portions of the bottom layer, and the exposed portions of the bottom layer are removed by a second etch process. In some embodiments, the first and second etch processes are performed in the same etch chamber. Different etchants may be used in the first and second etch processes in order to remove the portions of the middle layer and the portions of the bottom layer. In some embodiments, the etchant includes, but not limited to, $H_2$, Ar, $CF_4$, $CHF_3$, $N_2$, $O_2$, $CH_4$, or combinations thereof. In some embodiments, the second etch process used to remove portions of the bottom layer uses $H_2$ and $CF_4$ as etchants, and the second etch process is a combination of chemical and physical etching. In some embodiments, both the first and second etch processes are dry etches, such as plasma etch processes having a frequency ranging from about 12.88 MHz to about 14.24 MHz.

After the second etch process, portions of the bottom layer are removed to expose portions of the sacrificial layer 316. The exposed portions of the sacrificial layer 316 is then removed by a third etch process. In some embodiments, the third etch process is a dry etch process, such as a plasma etch process having a frequency substantially lower than that of the first and second etch processes. For example, the frequency of the third etch process may range from about 1.9 MHz to about 2.1 MHz. With the low frequency plasma etch process, sidewalls 322 of the remaining sacrificial layer 316 may be substantially straight. In other words, the third etch process removes portions of the sacrificial layer 316 to form openings 324 to expose portions of the oxide layer 314, and the sidewalls 322 of the remaining sacrificial layer 316 may be substantially perpendicular to the exposed surface of the oxide layer 314. The low frequency of the third etch process increases the electric field in the etch chamber, which leads to increased ability of power absorption, which leads to increased plasma density. As a result of the increased plasma density, the sidewalls 322 of the remaining sacrificial layer 316 are substantially perpendicular to the exposed surface of the oxide layer 314. The characteristics of the low frequency plasma etching may be based on the following equations:

$$P_{ohmic} = \frac{1}{2}|E|^2 \sigma_{dc} \frac{v_m}{\omega^2 + v_m^2}$$

$$E = J_T^- / (\sigma_p + j\omega\varepsilon_0)$$

where $P_{ohmic}$ is the power absorption; $\sigma_{dc}$ is the DC plasma conductivity; $v_m$ is the collision frequency; $\omega$ is the driving frequency; E is electric field; $J_T$ is the total current; $\sigma_p$ is the plasma conductivity; and $\varepsilon_0$ is vacuum permittivity.

The third etch process used to remove the portions of the sacrificial layer 316 may use any suitable etchant, such as Ar, $O_2$, $N_2$, He, HBr, $Cl_2$, or combinations thereof. In some embodiments, the etchant used in the third etch process is a chlorine-containing or bromine-containing etchant. In some embodiments, the third etch process also includes both chemical and physical etches. The first, second, and third etch processes may be performed in the same etch chamber. The etch chamber may be a dual-frequency etch chamber configured to change the frequency from a high frequency, such as over 12 MHz, to a low frequency, such as 2.1 MHz or less.

Figure 3D:
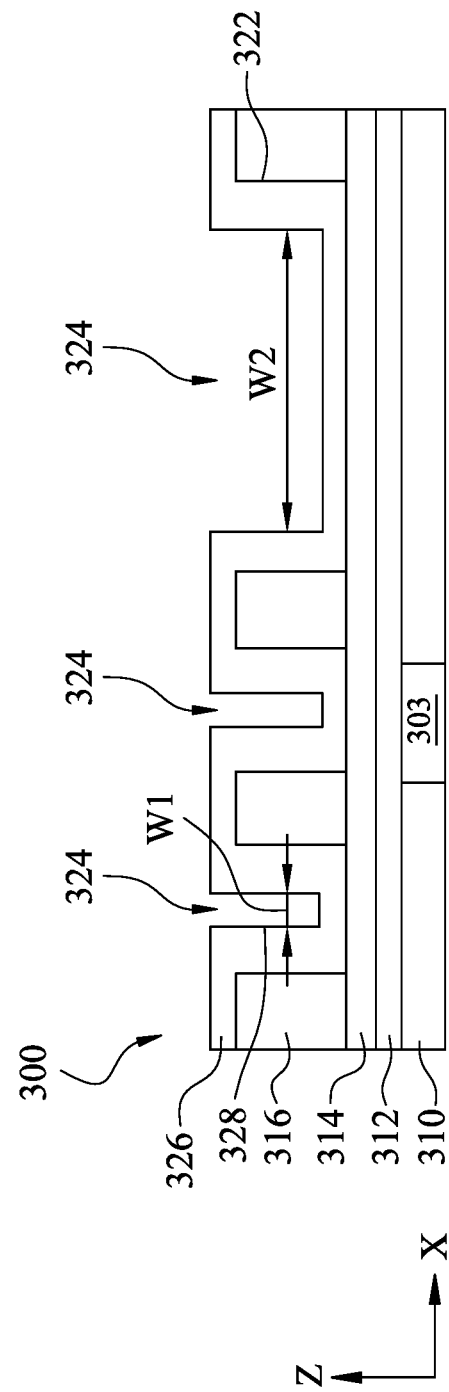

As shown in FIG. 3D, the low-k dielectric layer 326 is formed on the remaining sacrificial layer 316 and the oxide layer 314. The low-k dielectric layer 326 may include the same material as the dielectric layer 310. For example, the low-k dielectric layer 326 may include SiOCH. The low-k dielectric layer 326 may be a conformal layer formed by ALD. The low-k dielectric layer 326 partially fills the openings 324, as shown in FIG. 3D. The low-k dielectric layer 326 has a thickness ranging from about 10 nm to about 15 nm. The low-k dielectric layer 326 provides electric isolation of conductive features subsequently formed over the oxide layer 314. Thus, if the thickness of the low-k dielectric layer 326 is less than about 10 nm, the low-k dielectric layer 326 may not be sufficient to electrically isolate the conductive features. On the other hand, if the thickness of the low-k dielectric layer 326 is greater than about 15 nm, the openings 324 may be filled.

In some embodiments, the low-k dielectric layer 326 is a conformal layer formed by ALD. Because the sidewalls 322 of the sacrificial layer 316 are substantially straight, sidewalls 328 of the low-k dielectric layer 326 are also substantially straight. In other words, the sidewalls 328 of the low-k dielectric layer 326 are substantially perpendicular to the top surface of the oxide layer 314. As shown in FIG. 3D, the remaining openings 324 have different widths. For example, in some regions the openings 324 each has a first width W1, and in some regions the openings 324 each has a second width W2 substantially greater than the width W1. The region with the first width W1 may be a dense region, in which relatively more conductive features are formed therein. The region with the second width W2 may be an iso region, in which relatively less conductive features are formed therein. In some embodiments, the width W1 is substantially the same as the thickness of the low-k dielectric layer 326. Because the openings 324 having the widths W1 and W2 are not formed by a patterning process, the widths W1 and W2 may be smaller than the resolution limit of the patterning process. Furthermore, multiple patterning processes may be avoided. In some other embodiments, a low-k dielectric layer may be formed by FCVD, and an etching process is performed to form the openings in the low-k dielectric layer. In the iso region where a large portion of the low-k dielectric layer may be removed, the etch process may result in tapered sidewalls, leading to worsened RC delay. The low-k dielectric layer 326 formed by ALD to form the openings 324 having various widths W1 and W2 results in substantially straight sidewalls 328, leading to improved RC delay.

As shown in FIG. 3E, an anisotropic etch process is performed to remove portions of the low-k dielectric layer 326. In some embodiments, the anisotropic etch process is a selective plasma etch process that does not substantially affect the sacrificial layer 316 and the oxide layer 314. The selective plasma etch process may have a frequency ranging from about 12.88 MHz to about 14.24 MHz, and etchant such as $NF_3$, $H_2$, $N_2$, Ar, $C_4F_8$, $O_2$, or combinations thereof may be used. The anisotropic etch process removes the portions of the low-k dielectric layer 326 formed on horizontal surfaces, such as the top of the sacrificial layer 316 and the oxide layer 314. The remaining portions of the low-k dielectric layer 326 are in contact with the sidewall 322 of the sacrificial layer 316. Each portion of the low-k dielectric layer 326 may be a low-k dielectric feature that separates subsequently formed conductive features. The low-k dielectric features having a low k value, such as from about 1 to about 3.5, which reduces RC.

As shown in FIG. 3F, a multilayer structure 330 is disposed on the sacrificial layer 316, the portions of the low-k dielectric layer 326, and in the openings 324. The multilayer structure 330 includes one or more layers 332 and a photoresist layer 334 disposed on the one or more layers 332. In some embodiments, the multilayer structure 330 is the same as the multilayer structure 317, the one or more layers 332 is the same as the one or more layers 318, and the photoresist layer 334 is the same as the photoresist layer 320. The photoresist layer 334 may be patterned by the same patterning process as the patterned photoresist layer 320. The pattern of the photoresist layer 334 may include a plurality of openings 336, and each opening 336 is aligned with a corresponding portion of the sacrificial layer 316.

As shown in FIG. 3G, the pattern of the photoresist layer 334 is transferred to the one or more layers 332 to expose the sacrificial layer 316, and the exposed sacrificial layer 316 is then removed. In other words, the openings 336 are extended to expose portions of the oxide layer 314, as shown in FIG. 3G. In some embodiments, the etch process to remove the sacrificial layer 316 is a selective plasma etch process that does not substantially affect the low-k dielectric layer 326 and the oxide layer 314. The selective plasma etch process may have a frequency ranging from about 12.88 MHz to about 14.24 MHz, and etchant such as $Cl_2$, HBr, $N_2$, or combinations thereof may be used. The etch processes described above may be all performed in the same etch chamber, such as the dual-frequency etch chamber described above.

As shown in FIG. 3H, the multilayer structure 330 is removed. The multilayer structure 330 may be removed by one or more etch processes. For example, a first etch process is performed to remove the photoresist layer 334, a second etch process is performed to remove the middle layer of the one or more layers 332, and a third etch process is performed to remove the bottom layer of the one or more layers 332. The second and/or third etch process may be a selective etch process that does not substantially affect the portions of the low-k dielectric layer 326 and the oxide layer 314. As a result of the one or more etch processes, portions of the low-k dielectric layer 326, or low-k dielectric features, having substantially straight sidewalls 328 are disposed spaced apart on the oxide layer 314. As describe above, the spacing of the portions of the low-k dielectric layer 326 depends on the widths W1 and W2 (FIG. 3D) and on the width of the portions of the sacrificial layer 316.

Figure 3I:
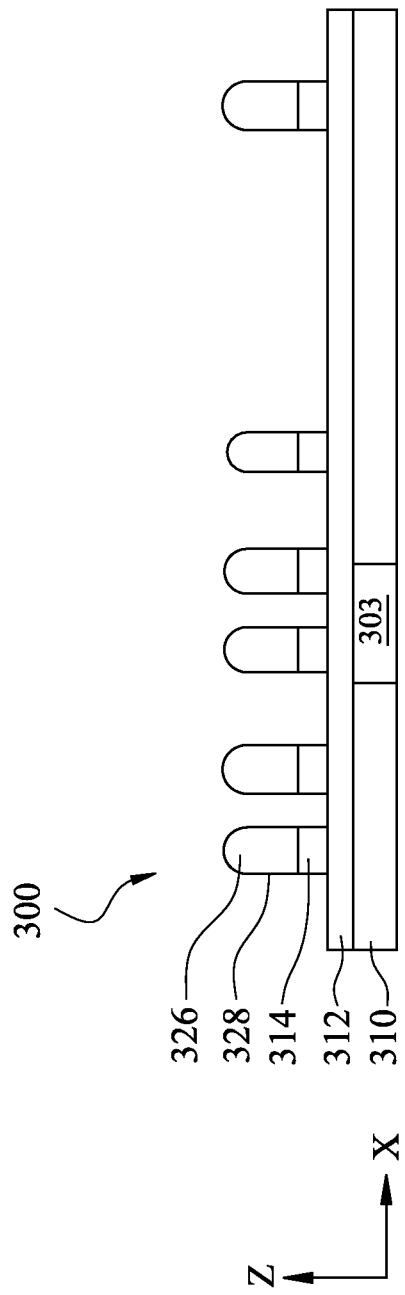

As shown in FIG. 3I, exposed portions of the oxide layer 314 are removed to expose portions of the etch stop layer 312. The removal of the exposed portions of the oxide layer 314 may be performed by a selective plasma etch process that does not substantially affect the portions of the low-k dielectric layer 326 and the etch stop layer 312. The selective plasma etch process may have a frequency ranging from about 12.88 MHz to about 14.24 MHz, and etchant such as $CHF_3$, He, or a combination thereof may be used. The selective plasma etch process may be performed in the same etch chamber as the other etch processes.

Figure 3J:
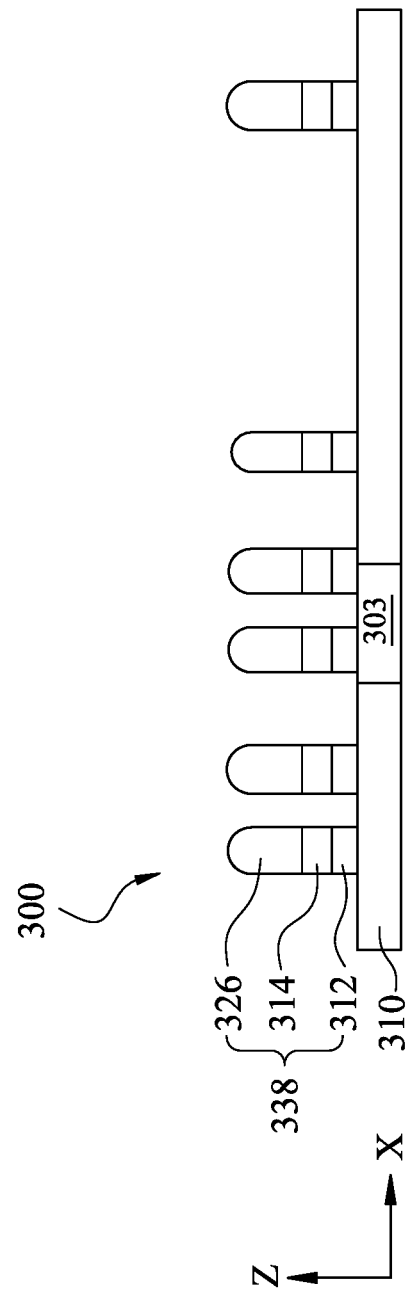

As shown in FIG. 3J, exposed portions of the etch stop layer 312 are removed. The removal of the exposed portions of the etch stop layer 312 may be performed by a wet clean process that does not substantially affect the portions of the low-k dielectric layer 326, the oxide layer 314, and the dielectric layer 310. As a result of the wet clean process, dielectric features 338 are disposed spaced apart on the dielectric layer 310. Each dielectric feature 338 includes a portion of the etch stop layer 312, a portion of the oxide layer 314, and a portion of the low-k dielectric layer 326. The thickness of the dielectric feature 338 may range from about 25 nm to about 50 nm.

As shown in FIG. 3K, a conductive material 340 is disposed on the portions of the low-k dielectric layer 326 and the dielectric layer 310. In some embodiments, a conformal barrier layer (not shown) may be first formed on the portions of the low-k dielectric layer 326 and the dielectric layer 310, and the conductive material 340 is formed on the barrier layer. In some embodiments, a liner (not shown) or a seed layer (not shown) may be formed between the barrier layer and the conductive material 340. The conductive material 340 may include the same material as the conductive feature 303.

As shown in FIG. 3L, a planarization process is performed to expose the portions of the low-k dielectric layer 326. The planarization process may be any suitable process, such as a chemical-mechanical polishing (CMP) process. The planarization process removes the portion of the conductive material 340 disposed over the low-k dielectric layer 326, and the remaining portions of the conductive material 340 are separated by the dielectric feature 338. Each portion of the conductive material 340 may be a conductive feature, such as a conductive line. At least one portion of the conductive material 340 is aligned with the conductive feature 303. In some embodiments, the portions of the conductive material 340 are the conductive features 304 shown in FIG. 2. As described above, the low-k dielectric layer 326 is a conformal layer formed by ALD, and the openings 324 (FIG. 3D) are not formed by a patterning process. The width W1 of the openings 324 (FIG. 3D) and a width W3 of the dielectric feature 338, which is defined by the thickness of the low-k dielectric layer 326, may be smaller than the resolution limit of the patterning process. In some embodiments, the width W1 is substantially the same as the width W3. For example, the width W1 and the width W3 each ranges from about 10 nm to about 15 nm.

Figure 4:
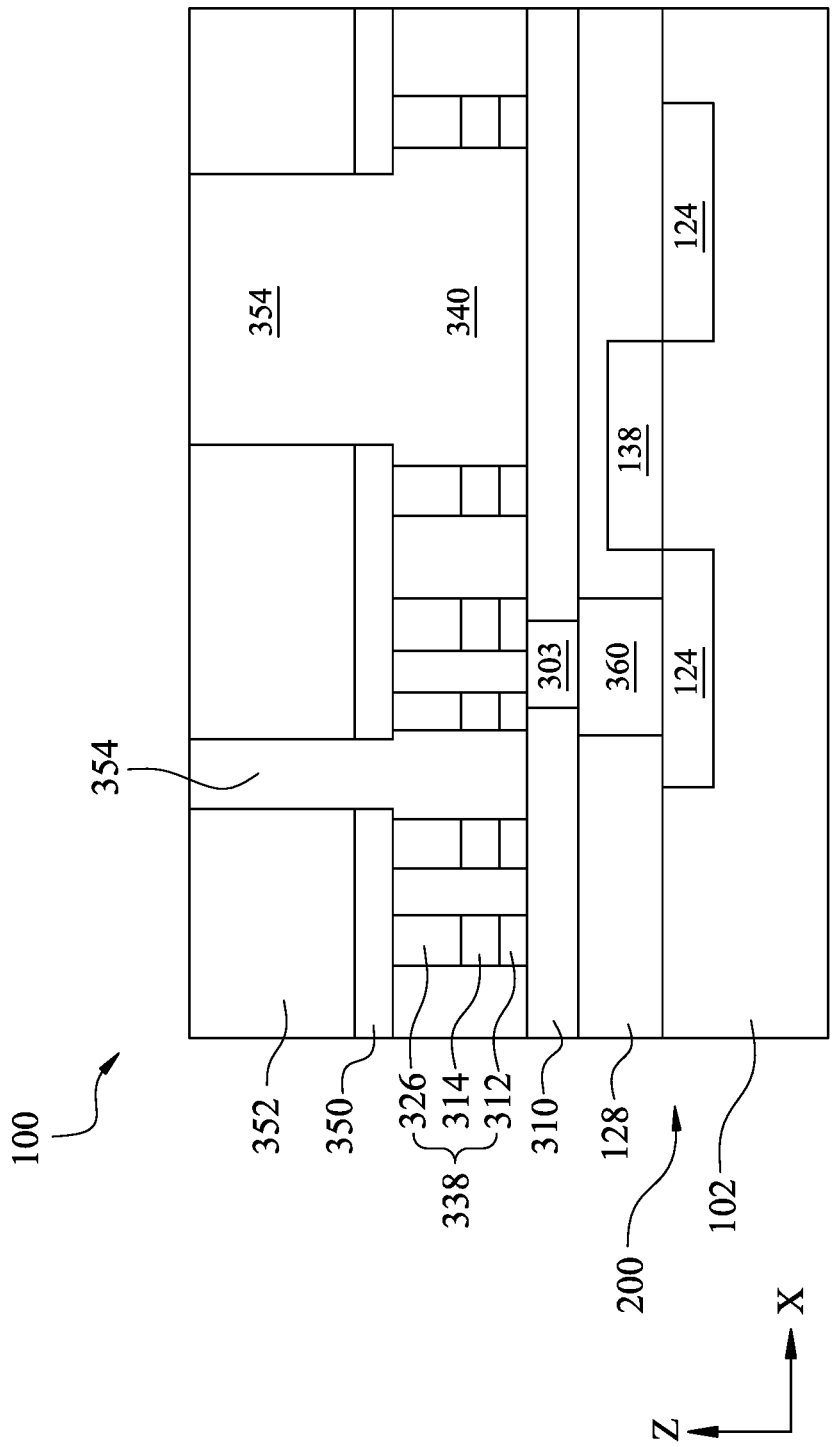
FIG. 4 is a cross-sectional side view of one of various stages of manufacturing the semiconductor device structure, in accordance with some embodiments.

FIG. 4 is a cross-sectional side view of the semiconductor device structure 100, in accordance with some embodiments. As shown in FIG. 4, the devices 200 are disposed on the substrate 102, the ILD layer 128 is disposed over the devices 200, a conductive contact 360 is disposed in the ILD layer 128 and over the S/D epitaxial feature 124. A silicide layer (not shown) may be disposed between the conductive contact 360 and the S/D epitaxial feature 124. The dielectric layer 310 is disposed on the ILD layer 128, and the conductive feature 303 is aligned with the conductive contact 360. The dielectric features 338 and the portions of the conductive material 340 are disposed on the dielectric layer 310 and the conductive features 303. In some embodiments, the dielectric features 338 are an IMD layer 302, and the portions of the conductive material 340 are the conductive features 304 shown in FIG. 2. An etch stop layer 350 is disposed on the portions of the conductive material 340 and the low-k dielectric layer 326. The etch stop layer 350 may include the same material as the etch stop layer 312. A low-k dielectric layer 352 is disposed on the etch stop layer 350, and conductive features 354 are disposed in the low-k dielectric layer 352. The low-k dielectric layer 352 may include the same material as the low-k dielectric layer 326, and the conductive features 354 may include the same material as the conductive features 303. In some embodiments, the low-k dielectric layer 352 is an IMD layer 302, and the conductive features 354 are conductive features 306 shown in FIG. 2.

The present disclosure in various embodiments provides an interconnect structure and methods for forming the same. In some embodiments, the interconnect structure 300 includes a dielectric feature 338 electrically isolates adjacent portions of the conductive material 340. The dielectric feature 338 may have a width substantially the same as the width of one of the adjacent portions of the conductive material 340. The dielectric feature 338 includes a low-k dielectric layer 326, an oxide layer 314, and an etch stop layer 312. The sidewalls 328 of the low-k dielectric layer 326 are substantially perpendicular to a top surface of a dielectric layer 310 disposed therebelow. Some embodiments may achieve advantages. For example, the substantially straight sidewalls 328 leads to improved RC delay, and the number of processes and the complicity of the processes to form the interconnect structure 300 are reduced.

An embodiment is a method. The method includes forming a first dielectric layer over one or more devices, forming a first conductive feature in the first dielectric layer, and forming two dielectric features over the first dielectric layer and the first conductive feature. At least one of the two dielectric features has a first width, and each dielectric feature includes a first low-k dielectric layer, an oxide layer, and a first etch stop layer. The method further includes forming a second conductive feature between the two dielectric features, and the second conductive feature has a second width substantially the same as the first width.

Another embodiment is a method. The method includes forming an oxide layer on a first etch stop layer, forming a sacrificial layer on the oxide layer, patterning the sacrificial layer to form a plurality of openings in the sacrificial layer, forming a first low-k dielectric layer on the patterned sacrificial layer and the oxide layer, removing portions of first low-k dielectric layer disposed on horizontal surfaces of the patterned sacrificial layer and on horizontal surfaces of the oxide layer to form a plurality of portions of the first low-k dielectric layer, removing the patterned sacrificial layer, and forming a conductive material between adjacent portions of the plurality of portions of the first low-k dielectric layer.

A further embodiment is a method. The method includes forming a sacrificial layer on an oxide layer and forming a multilayer structure on the sacrificial layer. The multilayer structure includes a photoresist layer disposed on one or more layers. The method further includes removing portions of the one or more layers by a first plasma etch process, and the first plasma etch process comprises using a first frequency. The method further includes removing portions of the sacrificial layer to form a patterned sacrificial layer having a plurality of openings by a second plasma etch process, and the second plasma etch process comprises using a second frequency substantially less than the first frequency. The first and second plasma etch processes are performed in the same etch chamber. The method further includes forming a low-k dielectric layer on the patterned sacrificial layer, and the low-k dielectric layer partially fills the plurality of openings. The method further includes filling the plurality of openings with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming a first dielectric layer over one or more devices;
    forming a first conductive feature in the first dielectric layer;
    forming two dielectric features over the first dielectric layer and the first conductive feature, wherein at least one of the dielectric features has a first width, and wherein each dielectric feature comprises a first low-k dielectric layer, an oxide layer, and a first etch stop layer; and
    forming a second conductive feature between the two dielectric features, wherein the second conductive feature has a second width substantially the same as the first width.

2. The method of claim 1, wherein the oxide layer comprises a semiconductor oxide, and the first etch stop layer comprises a nitride or a metal oxide.

3. The method of claim 2, wherein the oxide layer is silicon dioxide, and the first low-k dielectric layer comprises SiCOH.

4. The method of claim 1, wherein the first width and the second width each ranges from about 10 nm to about 15 nm.

5. The method of claim 1, wherein the second conductive feature is aligned with the first conductive feature.

6. The method of claim 1, further comprising:
    a second etch stop layer disposed over the two dielectric features and the second conductive feature;
    a second low-k dielectric layer disposed on the second etch stop layer; and
    a third conductive feature disposed in the second low-k dielectric layer.

7. A method, comprising:
    forming an oxide layer on a first etch stop layer;
    forming a sacrificial layer on the oxide layer;
    patterning the sacrificial layer to form a plurality of openings in the sacrificial layer;
    forming a first low-k dielectric layer on the patterned sacrificial layer and the oxide layer;
    removing portions of first low-k dielectric layer disposed on horizontal surfaces of the patterned sacrificial layer and on horizontal surfaces of the oxide layer to form a plurality of portions of the first low-k dielectric layer;
    removing the patterned sacrificial layer; and
    forming a conductive material between adjacent portions of the plurality of portions of the first low-k dielectric layer.

8. The method of claim 7, further comprising forming a first multilayer structure on the sacrificial layer before patterning the sacrificial layer, wherein the first multilayer structure comprises first one or more layers and a first photoresist layer.

9. The method of claim 8, further comprising removing portions of the first one or more layers of the first multilayer structure before patterning the sacrificial layer.

10. The method of claim 9, wherein the removing the portions of the first one or more layers of the first multilayer structure and patterning the sacrificial layer are performed in the same etch chamber.

11. The method of claim 7, wherein the first low-k dielectric layer is a conformal layer formed by atomic layer deposition.

12. The method of claim 11, wherein the forming the plurality of portions of the first low-k dielectric layer comprises removing portions of the first low-k dielectric layer disposed on horizontal surfaces.

13. The method of claim 12, further comprising forming a second multilayer structure over the patterned sacrificial layer before removing the patterned sacrificial layer, wherein the second multilayer structure comprises second one or more layers and a second photoresist layer.

14. The method of claim 13, further comprising removing portions of the second one or more layers of the second multilayer structure before removing the patterned sacrificial layer.

15. The method of claim 14, wherein the removing the portions of the second one or more layers of the second multilayer structure and removing the patterned sacrificial layer are performed in the same etch chamber.

16. The method of claim 7, further comprising forming a second low-k dielectric layer over the conductive material and the portions of the first low-k dielectric layer.

17. A method, comprising:
forming a sacrificial layer on an oxide layer;
forming a multilayer structure on the sacrificial layer, wherein the multilayer structure comprises a photoresist layer disposed on one or more layers;
removing portions of the one or more layers by a first plasma etch process, wherein the first plasma etch process comprises using a first frequency;
removing portions of the sacrificial layer to form a patterned sacrificial layer having a plurality of openings by a second plasma etch process, wherein the second plasma etch process comprises using a second frequency substantially less than the first frequency, wherein the first and second plasma etch processes are performed in the same etch chamber;
forming a low-k dielectric layer on the patterned sacrificial layer, wherein the low-k dielectric layer partially fills the plurality of openings; and
filling the plurality of openings with a conductive material.

18. The method of claim 17, wherein the low-k dielectric layer is a conformal layer formed by atomic layer deposition.

19. The method of claim 17, further comprising removing portions of the low-k dielectric layer.

20. The method of claim 19, further comprising removing portions of the oxide layer and portions of an etch stop layer disposed under the oxide layer.

* * * * *